(12) United States Patent
Chen et al.

(10) Patent No.: US 12,356,589 B2
(45) Date of Patent: Jul. 8, 2025

(54) PRE-COOLING DEVICE INTEGRATED LIQUID COOLING DISTRIBUTOR AND ITS SERVER LIQUID COOLING SYSTEM

(71) Applicant: Super Micro Computer, Inc., San Jose, CA (US)

(72) Inventors: Chia-Wei Chen, New Taipei (TW); Kun-Chieh Liao, New Taipei (TW); Yueh-Ming Liu, New Taipei (TW)

(73) Assignee: Super Micro Computer, Inc., San Jose, CA (US)

( * ) Notice: Subject to any disclaimer, the term of this patent is extended or adjusted under 35 U.S.C. 154(b) by 338 days.

(21) Appl. No.: 18/176,120

(22) Filed: Feb. 28, 2023

(65) Prior Publication Data

US 2024/0147665 A1  May 2, 2024

(30) Foreign Application Priority Data

Oct. 28, 2022 (TW) .................................. 111211834

(51) Int. Cl.
*H05K 7/20* (2006.01)

(52) U.S. Cl.
CPC ..... *H05K 7/20327* (2013.01); *H05K 7/20318* (2013.01); *H05K 7/20818* (2013.01)

(58) Field of Classification Search
CPC ........... H05K 7/20327; H05K 7/20318; H05K 7/20818
USPC ...................................................... 165/80.4
See application file for complete search history.

(56) References Cited

U.S. PATENT DOCUMENTS

| | | | | |
|---|---|---|---|---|
| 6,972,581 B2 * | 12/2005 | Yamashita | ......... | G01R 31/2874 |
| | | | | 324/756.05 |
| 7,796,389 B2 * | 9/2010 | Edmunds | ............ | F28D 15/0233 |
| | | | | 361/679.52 |
| 7,965,511 B2 * | 6/2011 | Refai-Ahmed | ..... | F28D 15/0275 |
| | | | | 174/15.1 |
| 12,255,104 B2 * | 3/2025 | Lee | ...................... | H10D 64/017 |
| 2013/0264030 A1 * | 10/2013 | Eckberg | ............. | H05K 7/20781 |
| | | | | 165/80.4 |
| 2022/0104403 A1 * | 3/2022 | Heydari | ............. | H05K 7/20318 |

\* cited by examiner

*Primary Examiner* — Steve S Tanenbaum
(74) *Attorney, Agent, or Firm* — Beyer Law Group LLP

(57) ABSTRACT

A precooling device integrated with a cooling distribution unit and a server liquid cooling system are provided. The precooling device includes a liquid cooling row, an adapter assembly, and a cooling distribution unit. The adapter assembly includes a flow joining row and a flow distribution row. The cooling distribution unit supplies a refrigerant from an interior thereof, and includes an outlet and an inlet communicating with the interior. The outlet communicates with the flow distribution row of the adapter assembly to deliver the refrigerant for heat exchange. The refrigerant being performed the heat exchange returns to the liquid cooling row through the flow joining row of the adapter assembly for precooling, and then returns from the liquid cooling row to the cooling distribution unit through the inlet. The refrigerant is precooled before returning to the cooling distribution unit.

15 Claims, 5 Drawing Sheets

PRE-COOLING DEVICE INTEGRATED LIQUID COOLING DISTRIBUTOR AND ITS SERVER LIQUID COOLING SYSTEM

CLAIM OF PRIORITY

This application claims benefit of Taiwanese Patent Application No. 111211834 filed on Oct. 28, 2022. The entire contents of each application noted above are hereby incorporated by reference.

BACKGROUND OF THE DISCLOSURE

Technical Field

The present disclosure is related to a cooling device, especially a precooling device integrated with a cooling distribution unit and a server liquid cooling system having the same.

Description of Related Art

The related-art cooling distribution units (CDU) are refrigerant-type heat dissipation devices used for cloud devices such as servers. The CDU mainly distributes a refrigerant, supplied from the outside or stored inside, through multiple pipelines, so as to effectively control required condensation or desired cooling temperatures, thereby achieving cooling and heat dissipation for a system.

During use of the related-art CDU, a temperature of the refrigerant rises after the refrigerant delivered by the CDU undergoes heat exchange with other external electronic components or heating elements. Therefore, when the higher-temperature refrigerant flows back into the CDU, the refrigerant often needs to be cooled by the CDU, so that the CDU can maintain the refrigerant supplied by itself at required low temperatures.

In light of the above, the inventor of the present disclosure has devoted himself to doing research and studying scientific principles and therefore can provide the present disclosure to solve the above problem of conventional techniques.

SUMMARY OF THE DISCLOSURE

It is a main objective of the present disclosure to provide a precooling device integrated with a cooling distribution unit and a server liquid cooling system. The present disclosure may reduce the influence of temperature rise on a refrigerant inside the cooling distribution unit by precooling the refrigerant before the refrigerant being delivered by the cooling distribution unit returns, so that it is easier to maintain the refrigerant inside the cooling distribution unit at sufficiently or expectedly low temperatures.

To achieve the above-mentioned objective, the present disclosure provides a precooling device integrated with a cooling distribution unit, including a liquid cooling row, an adapter assembly, and a cooling distribution unit. The liquid cooling row includes a condensation area, a flow distribution side communicating with one side of the condensation area, and a flow joining side communicating with another side of the condensation area. The adapter assembly includes a flow joining row and a flow distribution row. The flow joining row communicates with the flow distribution side of the liquid cooling row. The cooling distribution unit supplies a refrigerant from an interior of the cooling distribution unit, and includes an outlet and an inlet communicating with the interior of the cooling distribution unit. The outlet communicates with the flow distribution row of the adapter assembly to deliver the refrigerant for heat exchange. The refrigerant being performed the heat exchange returns through the flow joining row of the adapter assembly to the condensation area of the liquid cooling row for precooling, and then returns from the flow joining side of the liquid cooling row to the cooling distribution unit through the inlet.

To achieve the above-mentioned objective, the present disclosure provides a server liquid cooling system with a precooling device integrated with a cooling distribution unit, including: a server cabinet, at least one server chassis mounted on the server cabinet, and the cooling distribution unit arranged in the server cabinet. A refrigerant is supplied from an interior of the cooling distribution unit, and the cooling distribution unit includes an outlet and an inlet communicating with the interior of the cooling distribution unit. A liquid cooling row and an adapter assembly are disposed between the cooling distribution unit and the server chassis. The liquid cooling row includes a condensation area, a flow distribution side communicating with one side of the condensation area, and a flow joining side communicating with another side of the condensation area. The adapter assembly includes a flow joining row and a flow distribution row, and the flow joining row communicates with the liquid distribution side of the liquid cooling row. The outlet of the cooling distribution unit communicates with the flow distribution row of the adapter assembly to deliver the refrigerant into the server chassis for heat exchange. The refrigerant being performed the heat exchange returns through the flow joining row of the adapter assembly to the condensation area of the liquid cooling row for precooling, and then returns from the flow joining side of the liquid cooling row to the cooling distribution unit through the inlet of the cooling distribution unit.

DETAILED DESCRIPTION

A detailed description and technical content of the present disclosure are provided below with reference to accompanying drawings. However, the accompanying drawings are only for illustrative purposes and are not intended to limit the present disclosure.

Figure 1:
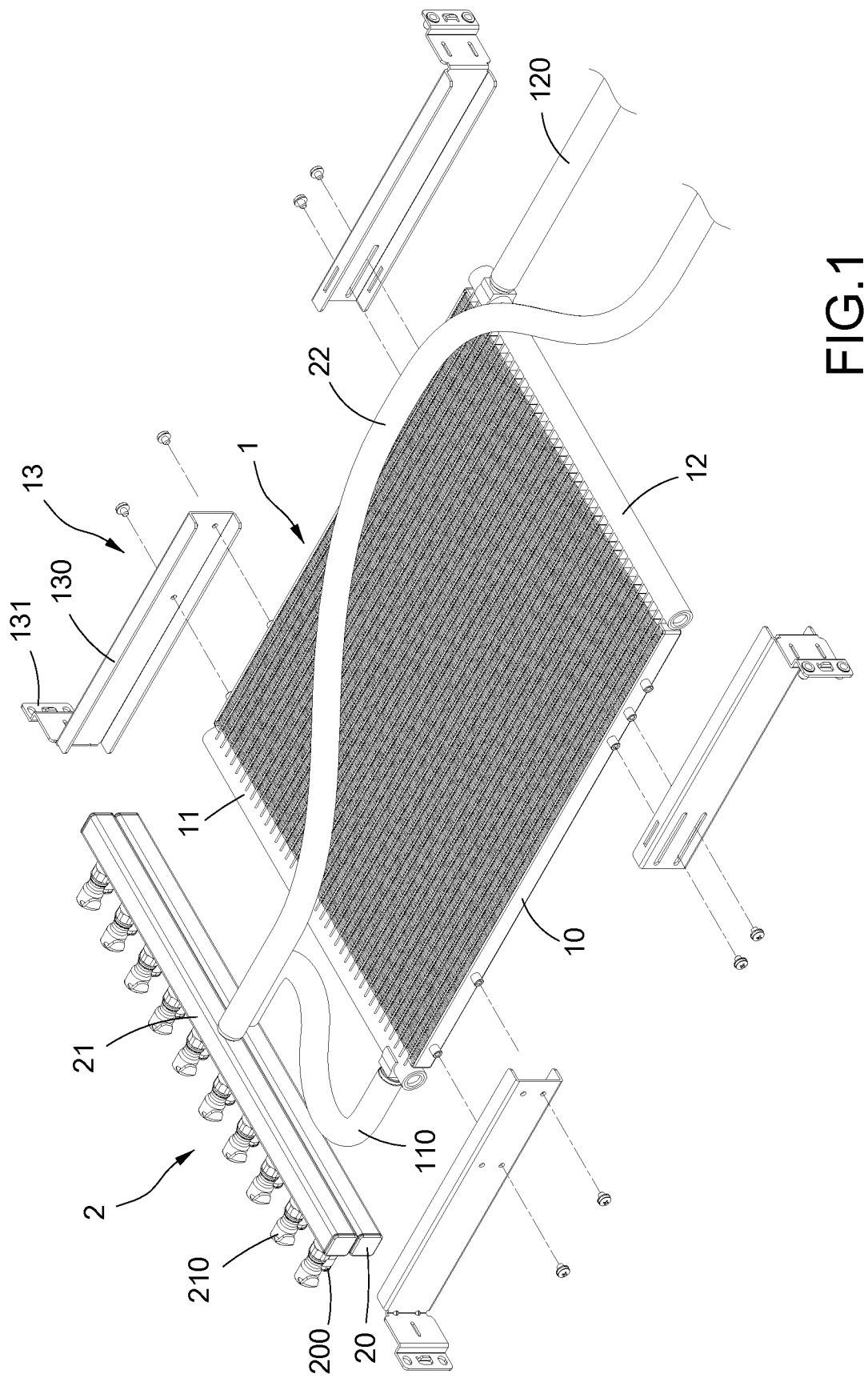
FIG. 1 is a perspective exploded view of a precooling device of the present disclosure.
Figure 2:
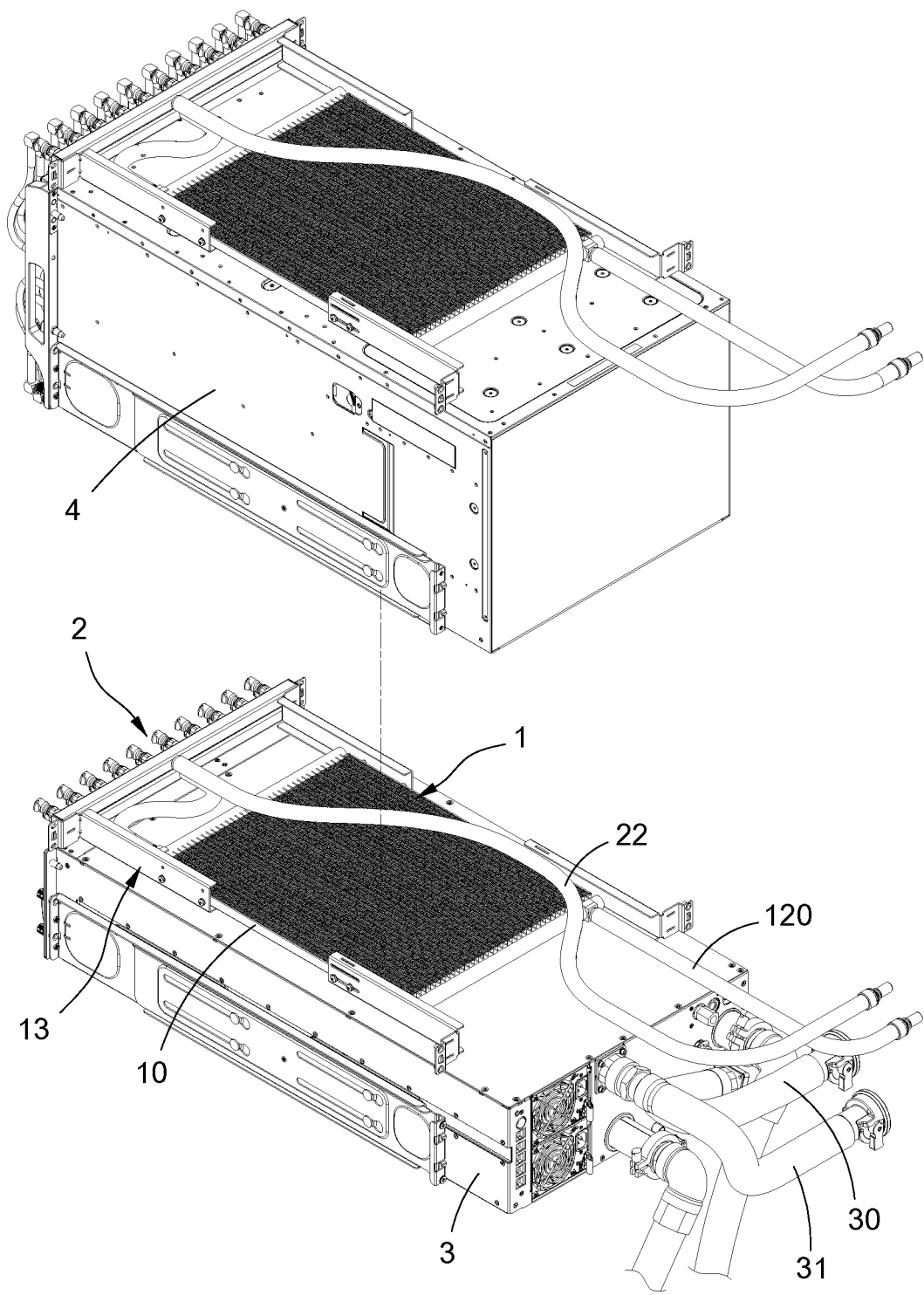
FIG. 2 is a perspective exploded view illustrating the present disclosure used in a server chassis.
Figure 3:
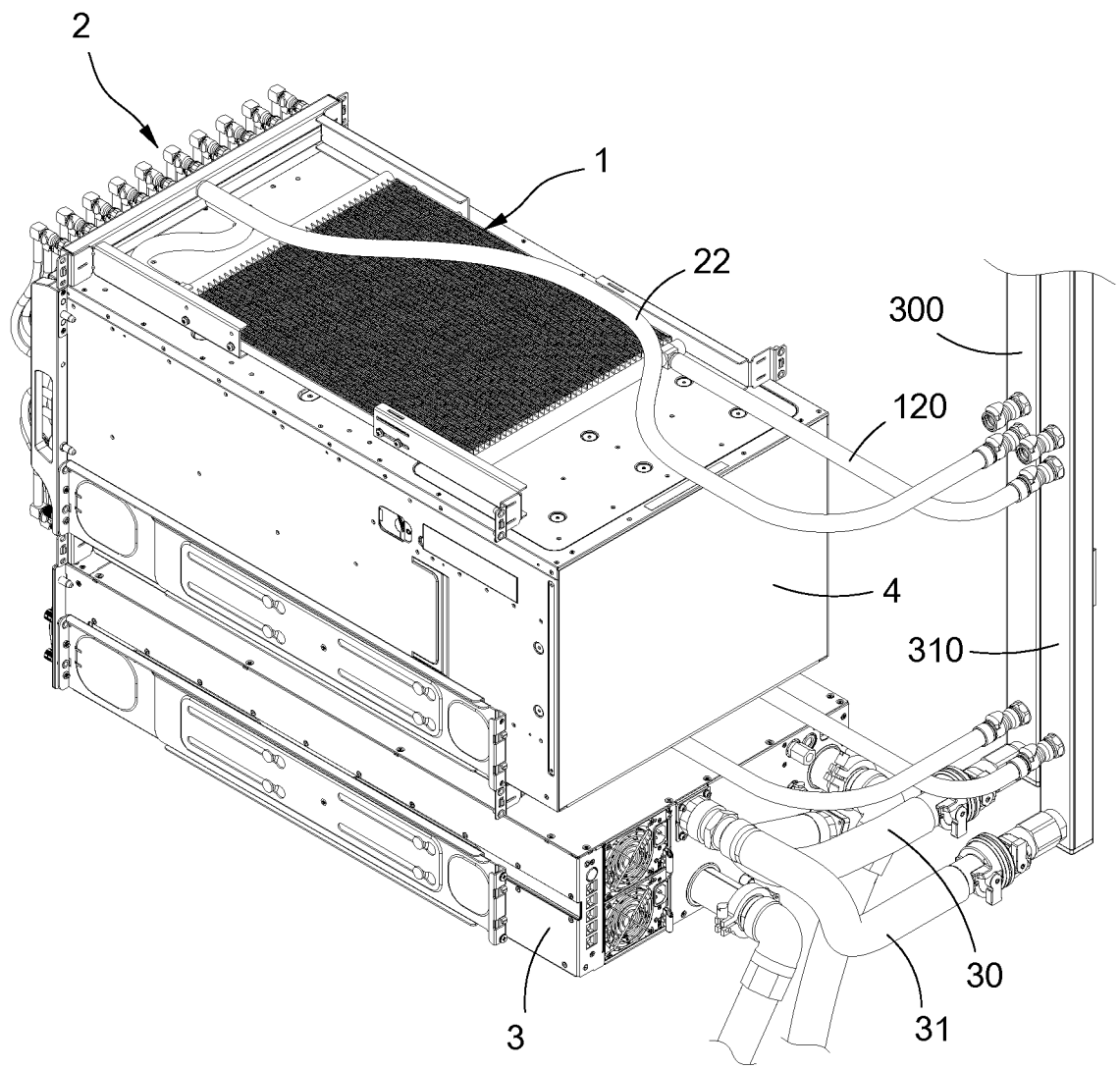
FIG. 3 is a perspective assembled view illustrating the present disclosure used in the server chassis.

Please refer to FIG. 1, FIG. 2, and FIG. 3, which are a perspective exploded view of a precooling device of the present disclosure, and a perspective exploded view and a perspective assembled view of the present disclosure used in a server chassis. The present disclosure provides a precooling device integrated with a cooling distribution unit and provides a server liquid cooling system. The precooling device includes a liquid cooling row 1, an adapter assembly 2, and a cooling distribution unit 3, and the precooling device may be cooperated with at least one server chassis 4 to dissipate heat. The server chassis 4 includes electronic components disposed inside, such as a motherboard, a central processing unit (CPU) and a storage medium, to function as a computer for independent calculation or processing.

The liquid cooling row 1 includes a condensation area 10, a flow distribution side 11 communicating with one side of the condensation area 10, and a flow joining side 12 communicating with another side of the condensation area 10. The liquid cooling row 1 is used to communicate between the above-mentioned cooling distribution unit 3 and the server chassis 4. Therefore, after precooled, the refrigerant being supplied to the server chassis 4 for cooling returns to the cooling distribution unit 3. The liquid cooling row 1 may be arranged as fins and pipes, so that precooling may be achieved by the refrigerant flowing inside the liquid cooling row 1 to make heat exchange.

The adapter assembly 2 includes a flow joining row (or flow joining passage) 20 and a flow distribution row (or flow distribution passage) 21. The adapter assembly 2 is disposed adjacent to the flow distribution side 11 of the above-mentioned liquid cooling row 1. The flow joining row 20 may be disposed under the flow distribution row 21, and disposed on substantially the same horizontal level as the above-mentioned liquid cooling row 1. The flow distribution side 11 of the liquid cooling row 1 communicates with the flow joining row 20 through a return tube 110. The flow joining row 20 is provided with a plurality of flow joining tubes 200, and the flow distribution row 21 is provided with a plurality of flow distribution tubes 210. The flow joining tubes 200 and the flow distribution tubes 210 all communicate with the above-mentioned server chassis 4. Accordingly, the refrigerant flowing through the server chassis 4 returns to the flow joining row 20 through the flow joining tubes 200, and then enters the liquid cooling row 1 through the return tube 110 to precool the refrigerant. The flow distribution row 21 communicates with the cooling distribution unit 3 through a conveying tube 22. Accordingly, the refrigerant supplied by the cooling distribution unit 3 is delivered to the server chassis 4 through the flow distribution tubes 210 of the flow distribution row 21 to take away heat from the server chassis 4.

Figure 4:
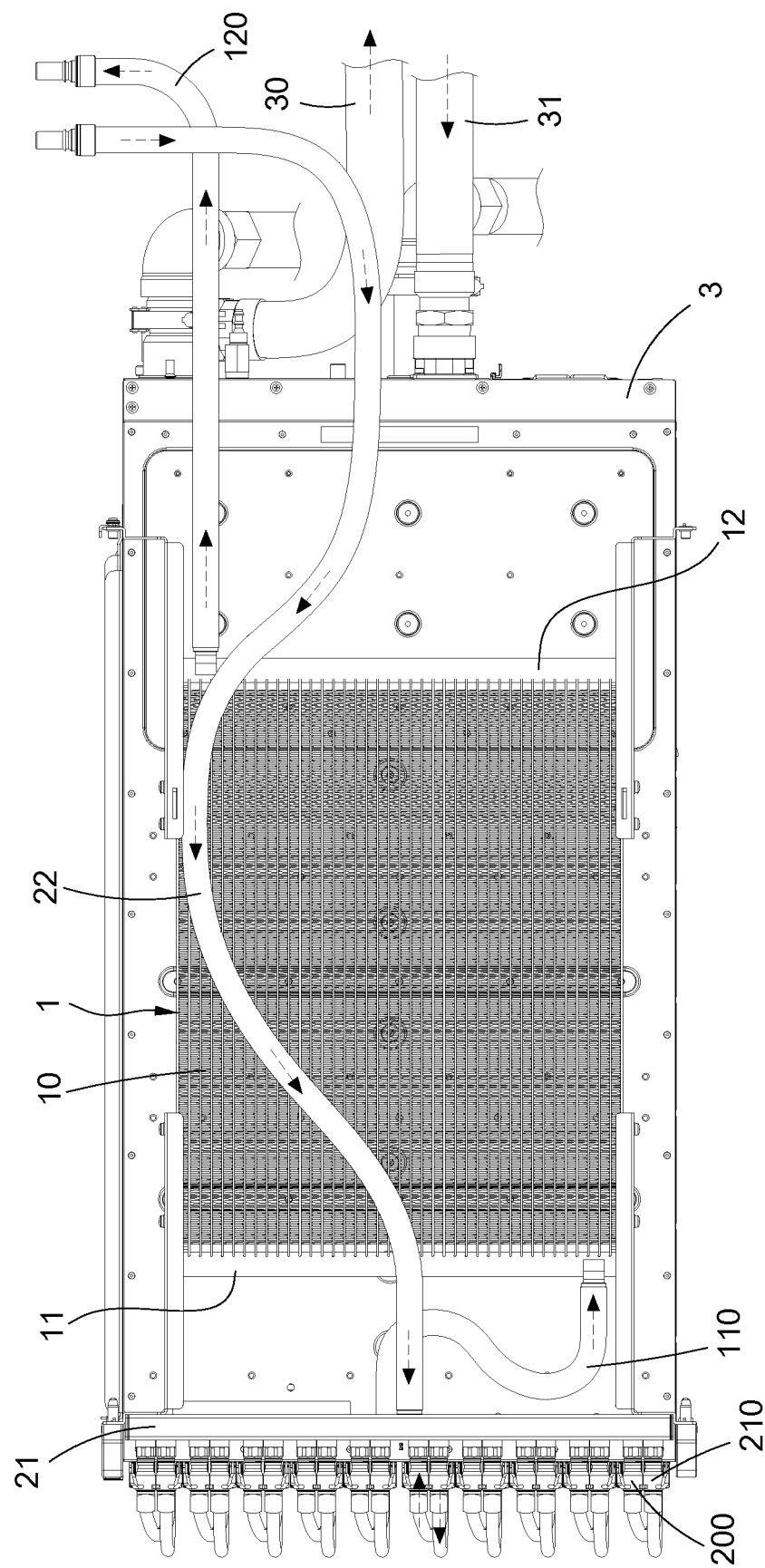
FIG. 4 is a schematic top view illustrating the present disclosure used in the server chassis.

The cooling distribution unit (CDU) 3 is used to supply the required refrigerant. The refrigerant may be various working fluids for cooling, such as a cooling agent. Please also refer to FIG. 4, the cooling distribution unit 3 mainly includes an outlet 30 and an inlet 31 communicating with the interior of the cooling distribution unit 3, so that the refrigerant inside the cooling distribution unit 3 is supplied to the adapter assembly 2 of the precooling device through the outlet 30 communicating with the conveying tube 22, and then is delivered to the server chassis 4 through the flow distribution row 21 of the adapter assembly 2. After the refrigerant undergoes heat exchange in the server chassis 4, the refrigerant is sent back to the flow joining row 20 of the adapter assembly 2 to be delivered to the liquid cooling row 1 of the precooling device through the return tube 110 for precooling. The flow joining side 12 of the liquid cooling row 1 is connected to the inlet 31 with an input tube 120, so that the refrigerant may be sent back to the cooling distribution unit 3 for cooling.

In summary, in the present disclosure, before the refrigerant returns to the cooling distribution unit 3 following the heat exchange, that is, the refrigerant is outside the inlet 31 of the cooling distribution unit 3, the refrigerant may return to the liquid cooling row 1 of the precooling device to be precooled in advance. Consequently, the refrigerant is cooled to a certain extent before entering the cooling distribution unit 3, and then flows into the cooling distribution unit 3. In this way, the refrigerant stored in the cooling distribution unit 3 may be prevented from being affected by a temperature rise of the refrigerant undergoing the heat exchange, so that the refrigerant in the cooling distribution unit 3 may be kept at sufficiently low temperatures.

Please also refer to FIG. 2 and FIG. 3. The present disclosure may further dissipate heat for the above-mentioned server chassis 4. Each time one server chassis 4 is added, one precooling device is also added. In the above-mentioned embodiment, the corresponding precooling devices are stacked on the cooling distribution unit 3. In the configuration of a server, each precooling device has a thickness which is commonly called "1U" (namely 1 rack unit, which is about 4.45 mm) thickness, so that the precooling device with the "1U" thickness is arranged between any two server chassis 4, when the server chassis 4 are stacked. Specifically, as shown in FIG. 1, in the present disclosure, a plurality of frames 13 are arranged laterally between the liquid cooling row 1 and the adapter assembly 2. Each of the frames 13 includes a side portion 130 fixed outside the condensation area 10 and an end portion 131 fixed to the adapter assembly 2. The side portion 130 and the end portion 131 may form an "L" shape to position the adapter assembly 2 on one side adjacent to the flow distribution side 11 of the liquid cooling row 1, so that under the "1U" thickness space configuration, the precooling device is stacked above the cooling distribution unit 3 (or disposed between the cooling distribution unit 3 and the adjacent server chassis 4), or disposed between any two adjacent server chassis 4. Accordingly, the refrigerant supplied by the cooling distribution unit 3 to any server chassis 4 is precooled before returning to the cooling distribution unit 3.

Figure 5:
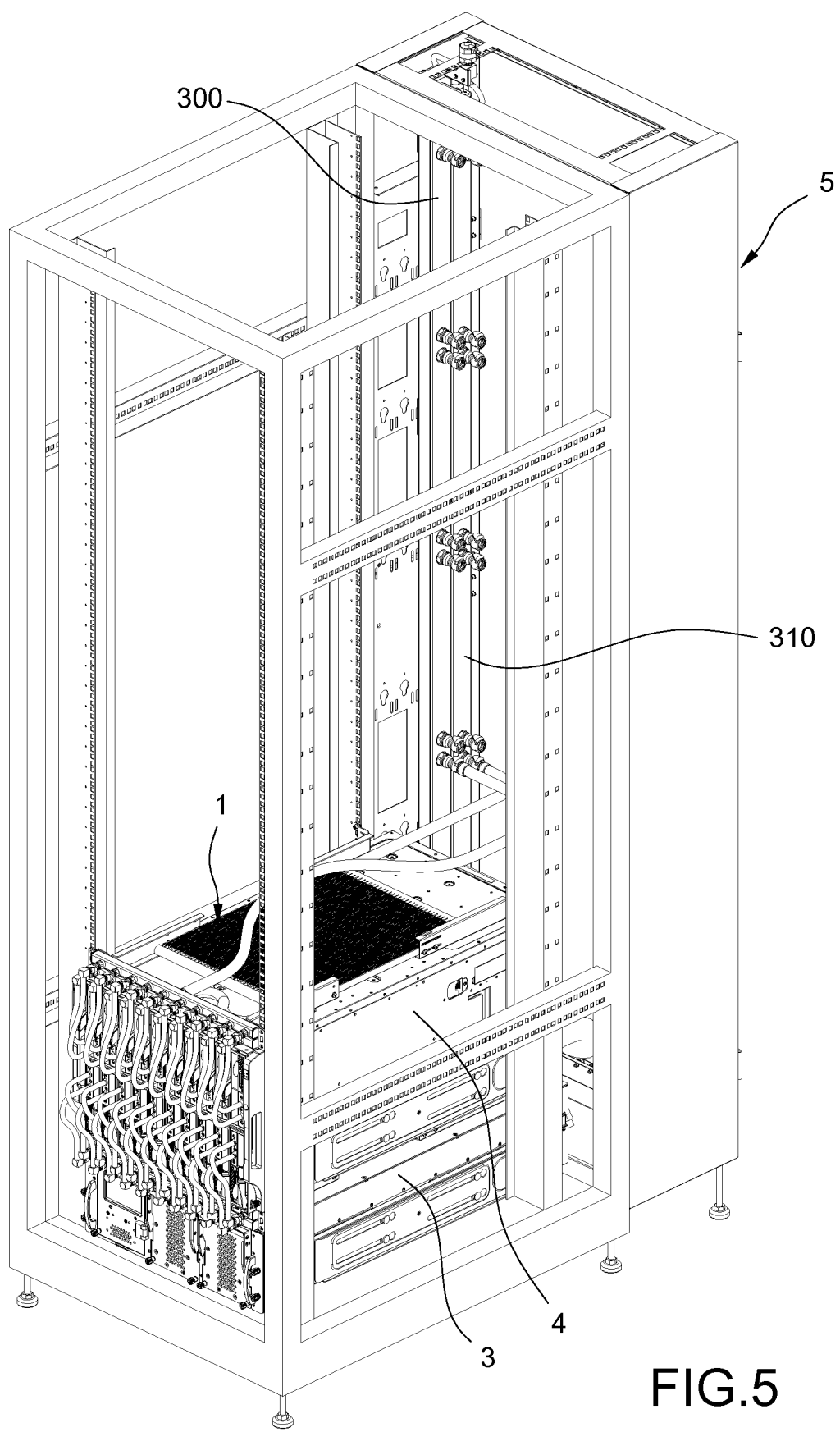
FIG. 5 is a schematic perspective view illustrating the present disclosure used in a server cabinet.

Furthermore, as shown in FIG. 5, in order to facilitate flowing of the refrigerant between the server chassis 4 after the server chassis 4 are stacked, a server cabinet 5, where each server chassis 4 is mounted, may be provided with an outgoing row (or outgoing pipe) 300 and an intake row (or intake pipe) 310 arranged vertically. The above-mentioned cooling distribution unit 3 is located under each server chassis 4. The outgoing row 300 and the intake row 310 are arranged side by side at any corner or an inner frame of the server cabinet 5. Each outgoing row 300 is used to communicate with the outlet 30 of the cooling distribution unit 3 and the conveying tube 22 of each adapter assembly 2. Each intake row 310 is used to communicate with the inlet 31 of the cooling distribution unit 3 and the input tube 120 of the liquid cooling row 1. In this way, overall communication for the refrigerant may be achieved.

Therefore, with the above-mentioned structure, the present disclosure may provide the precooling device integrated with the cooling distribution unit and the server liquid cooling system with the precooling device integrated with the cooling distribution unit.

The above only describes preferable embodiments of the present disclosure but is not intended to limit the protection scope of the present disclosure. Therefore, all equivalent structural changes based on the specification and the drawings of the present disclosure should be deemed to fall within the protection scope of the present disclosure.

What is claimed is:
1. A precooling device, comprising:
   a liquid cooling row, comprising a condensation area, a flow distribution side communicating with one side of the condensation area, and a flow joining side communicating with another side of the condensation area;

an adapter assembly, comprising a flow joining row and a flow distribution row, the flow joining row communicating with the flow distribution side of the liquid cooling row; and a cooling distribution unit, configured to supply a refrigerant from an interior thereof, and comprising an outlet and an inlet communicating with the interior;

wherein the outlet communicates with the flow distribution row of the adapter assembly to deliver the refrigerant to perform a heat exchange, the refrigerant being performed the heat exchange returns to the condensation area of the liquid cooling row through the flow joining row of the adapter assembly for precooling, and returns from the flow joining side of the liquid cooling row to the cooling distribution unit through the inlet.

2. The precooling device according to claim 1, further comprising a plurality of frames arranged laterally between the liquid cooling row and the adapter assembly, and each of the frames comprises a side portion fixed outside the condensation area and an end portion fixed to the adapter assembly.

3. The precooling device according to claim 2, wherein the side portion and the end portion are structured in an L shape.

4. The precooling device according to any one of claim 1, wherein the flow joining row and the flow distribution row of the adapter assembly are disposed adjacent to the flow distribution side of the liquid cooling row.

5. The precooling device according to claim 4, wherein the flow joining row of the adapter assembly is disposed under the flow distribution row.

6. A server liquid cooling system, comprising:
a server cabinet;
at least one server chassis, mounted on the server cabinet; and
a cooling distribution unit, arranged on the server cabinet, configured to supply a refrigerant from an interior thereof, and comprising an outlet and an inlet communicating with the interior;
wherein a liquid cooling row and an adapter assembly are disposed between the cooling distribution unit and the server chassis, the liquid cooling row comprises a condensation area, a flow distribution side communicating with one side of the condensation area, and a flow joining side communicating with another side of the condensation area, the adapter assembly comprises a flow joining row and a flow distribution row, and the flow joining row communicating with the flow distribution side of the liquid cooling row;

wherein the outlet of the cooling distribution unit communicates with the flow distribution row of the adapter assembly to deliver the refrigerant to the server chassis to perform a heat exchange, the refrigerant being performed the heat exchange returns to the condensation area of the liquid cooling row through the flow joining row of the adapter assembly for precooling, and returns from the flow joining side of the liquid cooling row to the cooling distribution unit through the inlet of the cooling distribution unit.

7. The server liquid cooling system according to claim 6, wherein the flow joining row of the adapter assembly is disposed under the flow distribution row.

8. The server liquid cooling system according to claim 6, wherein the cooling distribution unit is disposed below the server chassis.

9. The server liquid cooling system according to claim 6, wherein one liquid cooling row and one adapter assembly are corresponding to one server chassis.

10. The server liquid cooling system according to claim 6, wherein the server cabinet comprises an outgoing row and an intake row arranged vertically, and the outgoing row communicates with the outlet of the cooling distribution unit and a delivery tube of the adapter assembly, and the intake row communicates with the inlet of the cooling distribution unit and an input tube of the liquid cooling row.

11. The server liquid cooling system according to claim 6, wherein the outgoing row and the intake row are arranged side by side at one corner or an inner frame of the server cabinet.

12. The server liquid cooling system according to claim 6, wherein the liquid cooling row and the adapter assembly occupy a space with a 1U thickness in the server cabinet.

13. The server liquid cooling system according to claim 6, wherein a plurality of frames is arranged laterally between the liquid cooling row and the adapter assembly, and each of the frames comprises a side portion fixed outside the condensation area and an end portion fixed to the adapter assembly.

14. The server liquid cooling system according to claim 13, wherein the side portion and the end portion are structured in an L shape.

15. The server liquid cooling system according to any one of claim 12, wherein the flow joining row and the flow distribution row of the adapter assembly are disposed adjacent to the flow distribution side of the liquid cooling row.

* * * * *